United States Patent

Hikasa et al.

[11] Patent Number: 5,770,821
[45] Date of Patent: Jun. 23, 1998

[54] SUBMOUNT

[75] Inventors: Mitsutoshi Hikasa; Yoshihiko Numata; Reo Yamamoto, all of Fujisawa, Japan

[73] Assignee: Tokuyama Corporation, Japan

[21] Appl. No.: 679,673

[22] Filed: Jul. 12, 1996

[30] Foreign Application Priority Data

Jul. 18, 1995 [JP] Japan .................................. 7-181962

[51] Int. Cl.[6] .................................................. H01R 9/09
[52] U.S. Cl. ........................... 174/264; 29/852; 361/795
[58] Field of Search .................................. 174/259, 260, 174/261, 262, 264, 266; 29/852; 361/709, 714, 712, 724, 795, 810; 228/180.1, 180.21

[56] References Cited

U.S. PATENT DOCUMENTS

| | | | |
|---|---|---|---|
| 4,465,727 | 8/1984 | Fujita et al. | 428/138 |
| 4,942,076 | 7/1990 | Panicker et al. | 428/137 |
| 4,947,238 | 8/1990 | Ishii et al. | 257/751 |
| 5,125,962 | 6/1992 | Krentscher | 75/247 |
| 5,316,975 | 5/1994 | Maeda | 429/194 |
| 5,340,947 | 8/1994 | Credle et al. | 174/262 |
| 5,429,670 | 7/1995 | Miyoshi | 106/1.18 |
| 5,529,852 | 6/1996 | Sasame et al. | 428/620 |
| 5,561,322 | 10/1996 | Wilson | 257/703 |
| 5,587,111 | 12/1996 | Watanabe et al. | 252/514 |
| 5,661,089 | 8/1997 | Wilson | 438/125 |

FOREIGN PATENT DOCUMENTS

| | | |
|---|---|---|
| 61-119051 | 6/1986 | Japan . |
| 5-48213 | 2/1993 | Japan . |
| 5-160169 | 6/1993 | Japan . |

Primary Examiner—Bot L. Ledynh
Assistant Examiner—Dhiru R. Patel
Attorney, Agent, or Firm—Wenderoth, Lind & Ponack, L.L.P.

[57] ABSTRACT

A submount including:

an insulating substrate having therein a throughhole filled with a sintered metal powder, and an electroconductive layer formed on each of the two opposing surfaces of the insulating substrate, wherein the sintered metal powder filled in the throughhole of the insulating substrate is formed, for example, by filling, in the throughhole, a metal paste composed mainly of copper, tungsten, molybdenum or the like and then conducting firing and wherein the two electroconductive layers are electrically connected with each other at least partially by the sintered metal powder. The submount according to the present invention has a low electric resistance and high reliability and can be made in a small size. Therefore, it can be suitably used as a novel submount for semiconductor laser element, which promises electrical conduction between a semiconductor laser element and a heat sink.

16 Claims, 2 Drawing Sheets

SUBMOUNT

FIELD OF THE INVENTION

The present invention relates to a submount used for mounting a semiconductor laser element on a heat sink, particularly a novel submount for semiconductor laser element, promising electrical conduction between said element and a heat sink. Specifically, the present invention provides a submount which has high reliability and which can be made in a small size.

DESCRIPTION OF THE PRIOR ART

A submount is placed between a semiconductor laser element and a heat sink (a metal block made of copper or the like) and has a function of efficiently conducting the heat generated in the semiconductor laser element, to the heat sink.

In one type (A) of conventional submount for semiconductor laser element, the insulating substrate has an electroconductive layer on each of the two opposing surfaces and has no electroconductive layer on the sides. A semiconductor laser element is bonded on one of the electroconductive layers and a heat sink is bonded on the other electroconductive layer, both by soldering or the like. Since the substrate per se of the submount is an insulating material and has no electrical conductivity and moreover the substrate has no electroconductive layer on the sides, there is no electrical conduction between the two electroconductive layers formed on the two opposing surfaces of the substrate. When electrical conduction is necessary between the two electroconductive layers, the conduction has been achieved by arranging a wire, by bonding, between the electroconductive layer adjacent to the semiconductor laser element and the surface of the heat sink.

In other type (B) of conventional submount, the insulating substrate has an electroconductive layer on each of the two opposing surfaces and moreover has an electroconductive layer(s) on part or the whole part of the sides [this electroconductive layer(s) is (are) hereinafter referred to as side metallization layer(s)]. A semiconductor laser element is bonded on one of the electroconductive layers and a heat sink is bonded on the other electroconductive layer, both by soldering or the like. When electrical conduction is necessary between the two electroconductive layers, the conduction has been achieved by the side metallization layer(s).

In still other type (C) of conventional submount, the insulating substrate has an electroconductive layer on each of the two opposing surfaces and moreover has therein a throughhole whose inner wall has an electroconductive layer (this layer is hereinafter referred to as throughhole metallization layer). A semiconductor laser element is bonded on one of the two electroconductive layers and a heat sink is bonded on the other electroconductive layer, both by soldering or the like. When electrical conduction is necessary between the two electroconductive layers, the conduction has been achieved by the throughhole metallization layer formed on the throughhole wall [Japanese Patent Application Kokai (Laid-Open) No. 48213/1993 (HEI 5-48213)].

In the type (A) submount, however, wire breakage occurs in some cases, and the areas for wire bonding must be secured. The wire breakage results in reduced reliability and the areas secured for wire bonding make it difficult to produce a submount of small size.

In the type (B) submount, in bonding one electroconductive layer of the submount onto the heat sink with a solder or the like, the solder or the like crawls up the side metallization layer(s) and gives damage to the semiconductor laser element. Further, the solder or the like, when crawling up the side metallization layer(s), diffuses into the side metallization layer(s), whereby a solder alloy is formed and the thickness of the pure side metallization layer(s) containing no solder is decreased, resulting in increased electric resistance between the two electroconductive layers of the substrate. Furthermore, the type (B) submount, having the side metallization layer(s), has a higher risk of contacting with surrounding parts or members, making it difficult to obtain the total system in a small size.

In the type (C) submount, in bonding one electroconductive layer of the submount onto the heat sink with a solder or the like, the solder or the like crawls up the throughhole metallization layer and gives damage to the semiconductor laser element. Further, the solder or the like, when crawling up the throughhole metallization layer, diffuses into the throughhole metallization layer, whereby a solder alloy is formed and the thickness of the pure throughhole metallization layer containing no solder is decreased, resulting in increased electric resistance between the two electroconductive layers of the substrate. Furthermore, since no semiconductor laser element can be placed on the throughhole, the area secured for forming the throughhole makes larger the size of the produced submount.

As appreciated from the above-mentioned situation, a submount of novel structure is required which replaces the prior art, has high reliability and can be made in a smaller size.

SUMMARY OF THE INVENTION

An object of the present invention is to provide a submount comprising an insulating substrate and an electroconductive layer formed on each of the two opposing surfaces of the insulating substrate, which submount has a small electric resistance between the two electroconductive layers.

Other object of the present invention is to provide a submount comprising an insulating substrate and an electroconductive layer formed on each of the two opposing surfaces of the insulating substrate, which submount has high reliability in the electrical conduction between the two electroconductive layers.

Still other object of the present invention is to provide a submount comprising an insulating substrate and an electroconductive layer formed on each of the two opposing surfaces of the insulating substrate, in which a throughhole is formed in the insulating substrate and filled with a sintered metal powder for achieving electrical conduction between the two electroconductive layers and the bondability between the sintered metal powder filled in the throughhole and the insulating substrate is high.

Further objects of the present invention will become apparent from the following description.

The present inventors made a study in order to solve the above-mentioned problems of the prior art. As a result, the present inventors found out that the above objects could be achieved by forming a throughhole in an insulating substrate and filling the throughhole with a sintered metal powder to electrically connect the two electroconductive layers to be formed on the two opposing surfaces of the insulating substrate. The above finding has led to the completion of the present invention.

According to the present invention, there is provided a submount comprising:

an insulating substrate having therein a throughhole filled with a sintered metal powder, and an electroconductive layer formed on each of the two opposing surfaces of the insulating substrate, wherein the two electroconductive layers are electrically connected with each other at least partially by the sintered metal powder filled in the throughhole of the insulating substrate.

In these drawings, 1 refers to an insulating substrate; 2 refers to each electroconductive layer; 3 refers to a sintered metal powder filled in the throughhole of an insulating substrate; 4 refers to an aluminum nitride substrate; 5 refers to a solder layer; 6 refers to a sintered tungsten powder filled in the throughhole of an insulating substrate; 7 refers to a sintered molybdenum powder filled in the throughhole of an insulating substrate; 8 refers to an alumina substrate; and 9 refers to a sintered copper powder filled in the throughhole of an insulating substrate.

DETAILED DESCRIPTION OF THE INVENTION

Figure 1:
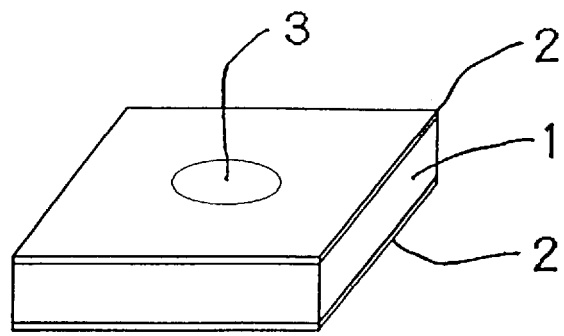
FIG. 1 is a schematic drawing showing an example of the submount of the present invention.

A typical structure of the submount of the present invention is shown in FIG. 1.

In the present invention, the insulating substrate, which is the main member of the submount, can be any conventional insulating substrate. It is specifically an insulating substrate made of aluminum nitride, beryllium oxide, silicon carbide, aluminum oxide, mullite, boron nitride, borosilicate glass or the like. Of these, an insulating substrate made of aluminum nitride is advantageously used because (1) it has a high thermal conductivity and can efficiently conduct the heat generated in the semiconductor laser element attached to the substrate, to the heat sink also attached to the substrate and (2) aluminum nitride has a thermal expansion coefficient close to that of Si which is a typical material constituting the semiconductor laser element. The insulating substrate preferably has a high thermal conductivity of 170 W/mK or more, more preferably 200 W/mK or more because the reliability of the semiconductor laser element can be increased thereby.

In the present invention, the electroconductive layer formed on each of the two opposing surfaces of the insulating substrate has no particular restriction as long as it has electrical conductivity; however, it is usually made of a metal. The metal can be any conventional metal. Preferred examples thereof are metals such as titanium, chromium, molybdenum, tungsten, tungsten-titanium alloy, aluminum, nickel-chromium alloy, tantalum and the like, and tantalum nitride is also used preferably, because they have good adhesivity to the insulating substrate. The electroconductive layers formed on the two opposing surfaces of the insulating substrate may be made of the same material or different materials.

Each electroconductive layer may consist of a single layer or may be a laminate of two or more layers. In the latter case (laminate), the above-mentioned metal or tantalum nitride is preferably used for the first layer which contacts directly with the insulating substrate, because of the high adhesivity to the insulating substrate. A conventional metal can also be used for the second layer laminated on the first layer, with copper, nickel, palladium, platinum or gold being preferred because of the good electrical conductivity. When a third layer is laminated on the second layer, a conventional metal can be used for the third layer, with, for example, gold, silver, palladium or platinum being preferred because of the good electrical conductivity and corrosion resistance. On the uppermost metal layer may be laminated at least one solder layer selected from, for example, lead-tin type solder, gold-tin type solder, gold-silicon type solder and gold-germanium type solder. The solder layer may be formed by patterning. Between the uppermost metal layer and the solder layer may be provided a solder diffusion-preventing layer. As the material for the solder diffusion-preventing layer, there is preferably used platinum, tungsten, a tungsten-titanium alloy or molybdenum for the high preventability for solder diffusion.

In the present invention, the sintered metal powder is filled in the throughhole of the insulating substrate. The metal may be any conventional metal. Tungsten or molybdenum is preferably used when the sintered metal powder filled in the throughholes is formed by co-firing, because said metal shows high heat resistance during the firing and further has relatively high electrical conductivity. When the sintered metal powder filled in the throughholes is formed by post-firing, copper, silver, gold, nickel or palladium is preferably used because of the high electrical conductivity.

In the present invention, the dimension, shape and number of the throughhole have no restriction; and the external dimension of the submount has no restriction, either. The preferable diameter of the throughhole is generally 0.1–0.8 mm in view of the fillability of a metal paste into the throughhole. The electric resistance of the sintered metal powder filled in the throughhole has no particular restriction, but is preferably 0.5 Ω or less, more preferably 0.1 Ω or less so that the semiconductor laser element attached to the submount can exhibit its function sufficiently. The lower limit of the electric resistance is preferred to be as low as possible, but the present submount shows an electric resistance of generally 0.001 Ω or more.

Preferably, the sintered metal powder filled in the throughhole of the insulating substrate contains a powdery additive for strengthening the bond between the sintered metal powder and the insulating substrate, in a dispersed state. The presence of the powdery additive can increase the bond between the sintered metal powder and the insulating substrate, whereby no interfacial peeling occurs between the sintered metal powder and the insulating substrate even after conducting a durability test such as heat cycle test or the like.

The powdery additive is preferably an aluminum nitride powder, a titanium powder or the like. Preferably, the aluminum nitride powder has an average particle diameter (D1) of 0.1–1.0 µm as measured by a method described later and the titanium powder has an average particle diameter of 0.5–5 µm.

The amount of the powdery additive has no particular restriction but is preferably 1.0–10% by weight, more preferably 3–8% by weight in view of the good electrical conductivity to be possessed by the sintered metal powder and the prevention of the interfacial peeling between the sintered metal powder and the insulating substrate.

The submount of the present invention can be produced by producing an insulating substrate whose throughholes have been filled with a sintered metal powder, grinding or polishing the surfaces of the insulating substrate as necessary, and forming an electroconductive pattern on each of the two opposing surfaces of the insulating substrate. In production of the insulating substrate whose throughholes have been filled with a sintered metal powder, any conventional technique can be used with a co-firing process or a post-firing process being particularly preferable.

In the co-firing process, a green sheet, which is not fired yet, is subjected to punching or the like to form throughholes therein; a metal paste is filled in each throughhole by printing, forcing or the like; and the resulting green sheet is subjected to degreasing and firing to obtain an insulating substrate having throughholes filled with a sintered metal powder. The firing temperature varies depending upon the material of the insulating substrate but is selected generally in the range of 1,000°–2,000° C. The firing temperature is 1,600°–2,000° C., preferably 1,700°–1,900° C. when the insulating substrate is, for example, aluminum nitride.

In the post-firing process, a green sheet is subjected to punching or the like to form throughholes therein and then is subjected to degreasing and firing to obtain an insulating substrate having throughholes. Alternatively, a green sheet or a pressed material is subjected to degreasing and firing and the fired sheet is subjected to laser processing, ultrasonic processing or the like to form throughholes therein to obtain an insulating substrate having throughholes. A metal paste is filled in the throughholes of the insulating substrate, followed by firing, to obtain an insulating substrate having throughholes filled with a sintered metal powder. The firing temperature after filling of the metal paste varies depending upon the kind of the metal paste but is generally 600°–1,400° C.

The metal paste used for formation of the sintered metal powder is preferably one generally containing 100 parts by weight of a powder of the above-mentioned metal, 0.1–5 parts by weight of an organic binder, 1–20 parts by weight of an organic solvent and 1–10 parts by weight of the above-mentioned powdery additive for strengthening the bond between the sintered metal powder and the insulating substrate.

The metal powder has an average particle diameter of preferably 0.1–10 $\mu$m, more preferably 1–5 $\mu$m when the co-firing process is used, and preferably 0.1–20 $\mu$m, more preferably 1–10 $\mu$m when the post-firing process is used. The organic binder includes an acrylic resin, ethyl cellulose, cellulose acetate butyrate, cellulose acetate propionate, nitrocellulose, acetyl cellulose, etc. The organic solvent includes terpineol, butyl carbitol acetate, carbitol, butyl carbitol, carbitol acetate, 2,2,4-trimethyl-1,3-pentanediol monoisobutyrate, cellosolve, methyl cellosolve, butyl cellosolve, cellosolve acetate, butyl cellosolve acetate, n-butyl acetate, etc.

The thus-obtained insulating substrate having throughholes filled with a sintered metal powder is subjected to surface grinding or surface polishing as necessary. The grinding or polishing can be conducted by any conventional method, generally by lapping, polishing, barrel grinding, sand blasting, polishing by grinder, or the like. The preferable surface roughness Ra of the insulating substrate varies depending upon the purpose of the submount obtained, but is generally 0.8 $\mu$m or less, preferably 0.05 $\mu$m or less in view of the die bondability of semiconductor laser element to submount obtained.

In the present invention, an electroconductive pattern is formed on each of the two surfaces of the above-formed insulating substrate having throughholes filled with a sintered metal powder. The formation of an electroconductive pattern can be conducted by any conventional technique. The formation of an electroconductive layer constituting an electroconductive pattern can be conducted by a conventional technique such as sputtering, vapor deposition, ion plating or the like. In forming an electroconductive layer by, for example, sputtering, the insulating substrate is placed in a vacuum chamber and kept generally at room temperature to 300° C.; the chamber inside is made vacuum ($2\times10^{-3}$ Pa or less); argon gas is introduced into the chamber; and sputtering is conducted at an RF electric source power of 0.2–3 KW at a pressure of 0.2–1.0 Pa to form an electroconductive layer of desired thickness.

The shape of the electroconductive pattern used in the present invention can be selected desirably so as to meet the application of the submount obtained. By subjecting the electroconductive layer formed above, to patterning, a desired electroconductive pattern is formed. Patterning can be conducted by any appropriate conventional technique which varies depending upon the application of the submount obtained. Examples of the technique are a metal mask method, a wet etching method and a dry etching method. When patterning is conducted by, for example, a metal mask method, a metal mask having a given pattern is fixed on the insulating substrate; and an electroconductive pattern is formed by the above-mentioned sputtering or the like. When an electroconductive pattern is formed by a dry etching method, a desired pattern is formed using a photoresist or the like, on the insulating substrate on which an electroconductive layer has been formed by the above-mentioned sputtering or the like; ion milling or the like is applied to remove the portion of the electroconductive layer not covered by the resist; then, the resist is removed; thereby, an electroconductive pattern is obtained.

The electroconductive layer is generally formed on the sintered metal powder filled in the throughhole in order to connect the two electroconductive layers of the opposing surfaces electrically.

The thus-obtained insulating substrate having therein throughholes filled with a sintered metal powder and having an electroconductive layer on each of the two opposing surfaces, is generally cut into a desired size to obtain each submount of the present invention. Cutting can be conducted by any conventional technique. Cutting is ordinarily conducted by the use of a dicing machine. Cutting is generally conducted so as not to pass the throughholes filled with a sintered metal powder, but may be conducted so as to pass the throughholes.

As appreciated from the above, the submount of the present invention comprises:

an insulating substrate having therein a throughhole filled with a sintered metal powder, and an electroconductive layer formed on each of the two opposing surfaces of the insulating substrate, wherein the two electroconductive layers are electrically connected with each other at least partially by the sintered metal powder filled in the throughhole of the insulating substrate. Therefore, the present submount needs no wire bonding and is free from wire breakage; further, the present submount has no side metallization layer(s) or no throughhole metallization layer, causes no crawling up of solder or no consequent alloy formation, and invites neither damage to semiconductor laser element nor increased electric resistance. Furthermore, no need of wire bonding enables production of a smaller submount; in addition, possibility of mounting of semiconductor laser element directly on sintered metal powder, also enables production of a smaller submount. Therefore, the submount of the present invention has high reliability; can be produced in a smaller size, and has a very high industrial value.

The present invention is hereinafter described more specifically by way of Examples. However, the present invention is not restricted to these Examples.

In the Examples, the average particle diameter (D1) of aluminum nitride determined from its specific surface area was calculated using the following formula.

$$D1\ (\mu m) = 6/S \times 3.26$$

[S=specific surface area ($m^2/g$) of AlN)]

The average particle diameter of aluminum nitride by sedimentation method was measured using a centrifugal particle size distribution tester (CAPA 500, a product of HORIBA, LTD.).

The particle diameter of a titanium powder or of the metal powder constituting a sintered metal powder was determined using Sub-Sieve Sizer (a product of Fisher Co.).

EXAMPLE 1

To 100 parts by weight of an aluminum nitride powder having an average particle diameter of 1.60 μm as measured by a sedimentation method, a specific surface area of 2.5 $m^2/g$ and an average particle diameter of 0.74 μm as calculated from the specific surface area were added 5 parts by weight of an yttrium oxide powder (a sintering aid) having a specific surface area of 12.5 $m^2/g$, 15 parts by weight of butyl methacrylate (an organic binder and dispersant), and 5 parts by weight of dioctyl phthalate (a plasticizer). They were mixed in a ball mill using toluene (a solvent) to obtain a slurry. The slurry was degassed and then made into a green sheet having a thickness of 0.6 mm, by a doctor blade method. From this green sheet was cut out a green sheet of 64 mm×64 mm, followed by punching to form 2,397 throughholes each having a diameter of 250 μm in the green sheet. Each throughhole was filled, by forcing, with a tungsten paste having a composition shown in Table 1, whereby a green sheet having therein throughholes filled with a tungsten paste was formed. The green sheet was subjected to degreasing at 800° C. in a nitrogen atmosphere. The degreased sheet was placed in an aluminum nitride setter and heated at 1,850° C. for 8 hours in a nitrogen atmosphere to obtain an aluminum nitride substrate of 54 mm×54 mm×0.4 mm (thickness) having therein throughholes (diameter: 200 μm) filled with a sintered tungsten powder. The substrate was measured for thermal conductivity, which was 210 W/mK.

Figure 2:
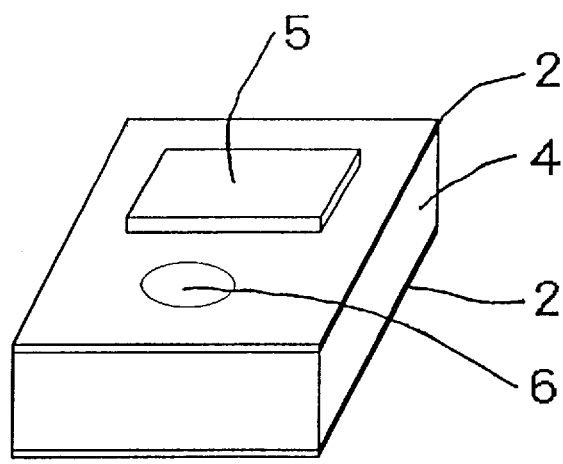
FIG. 2 is a schematic drawing showing other example of the submount of the present invention.

Using this aluminum nitride substrate, submounts of the same size, shown in FIG. 2 were produced. That is, the substrate 4 was subjected to mirror-like finishing (surface roughness Ra: 0.03 μm) at the two opposing surfaces so as to have a thickness of 0.25 mm. An electroconductive layer 2 [first layer/second layer/third layer=Ti (0.1 μm)/Pt (0.2 μm)/Au (0.5 μm)] was formed on each of the two opposing surfaces of the substrate after mirror-like finishing, by sputtering. On the upper electroconductive layer was formed a solder pattern 5 (thickness: 5 μm) consisting of AuSn (Au: 80 wt. %), by vapor deposition using a metal mask. The resulting substrate having thereon two electroconductive layers 2 and a solder pattern 5 was subjected to dicing to obtain submounts each of 0.8 mm×0.7 mm.

100 of these submounts were measured for electric resistance between the upper (top) surface and the lower (bottom) surface, which gave an average electric resistance of 0.021 Ω. To the upper surface of each submount was bonded a semiconductor laser element via the solder pattern 5; and a copper-made heat sink was bonded on the lower surface of each submount, by the use of an AuSn solder (Au: 80 wt. %). Then, electric resistance was measured between the upper surface of each submount and the upper surface of each heat sink, which gave an average electric resistance of 0.022 Ω. Thus, electrical conduction was good even after bonding, and there was substantially no difference in average electric resistance between before and after bonding. When each of the bonded semiconductor laser elements was operated, the operation was normal in all the elements, and the yield of the semiconductor laser element was 100%.

Each submount to which a semiconductor laser element and a heat sink had been bonded as above (this assembly is hereinafter referred to as optical semiconductor device), was subjected to 1,000 cycles of a heat cycle test (one cycle consisted of keeping at −50° C. for 30 minutes and then keeping at 125° C. for 30 minutes). Then, these 100 optical semiconductor devices were measured for electric resistance between the upper surface of each submount and the upper surface of each heat sink, which gave an average electric resistance of 0.023 Ω. Thus, electrical conduction was good even after the heat cycle test, and there was substantially no difference in average electric resistance between before and after the heat cycle test.

Also the above 100 submounts were observed using a microscope to examine the condition of the interface between the insulating substrate and the sintered tungsten powder filled in the throughhole. As a result, there was no peeling at the interface.

EXAMPLE 2

An aluminum nitride green sheet of 64 mm×64 mm×0.6 mm (thickness) was produced in the same manner as in Example 1. In the green sheet were formed 1,036 throughholes each of 200 μm in diameter, by punching. The resulting green sheet was subjected to degreasing and firing under the same conditions as in Example 1, to obtain an aluminum nitride substrate of 54 mm×54 mm×0.4 mm (thickness) having 1,036 throughholes of 150 μm in diameter. The aluminum nitride substrate had a thermal conductivity of 212 W/mK. Into each throughhole of the substrate was filled, by screen printing, a molybdenum paste having a composition shown in Table 1. The resulting substrate was fired at 1,300° C. in a nitrogen/hydrogen mixed atmosphere to form an aluminum nitride substrate having therein throughholes filled with a sintered molybdenum powder.

Figure 3:
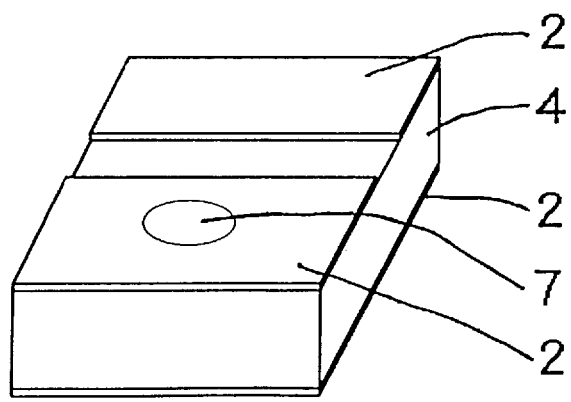
FIG. 3 is a schematic drawing showing other example of the submount of the present invention.

Using this aluminum nitride substrate, submounts of the same size, shown in FIG. 3 were produced. That is, the substrate 4 was subjected to mirror-like finishing (surface roughness Ra: 0.02 μm) at the two opposing surfaces so as to have a thickness of 0.2 mm. An electroconductive layer 2 [first layer/second layer/third layer=Ti (0.4 μm)/Ni (2.0 μm)/Au (1.0 μm)] was formed on each of the two opposing surfaces of the substrate after mirror-like finishing, by sputtering. The upper electroconductive layer 2 was subjected to wet etching so as to have a pattern. The resulting substrate having thereon electroconductive layers 2 was subjected to dicing to obtain submounts each of 1.5 mm×1.0 mm.

100 of these submounts were measured for electric resistance between the upper (top) surface and the lower (bottom) surface, which gave an average electric resistance of 0.015 Ω. To the upper surface of each submount was bonded a semiconductor laser element by the use of a PbSn solder (Sn: 60 wt. %); and a heat sink was bonded on the lower surface of each submount by the use of an PbSn solder (Sn: 60 wt. %). Then, electric resistance was measured between the upper surface of each submount and the upper surface of each heat sink, which gave an average electric resistance of 0.017 Ω. Thus, electrical conduction was good even after bonding, and there was substantially no difference in average electric resistance between before and after bonding. When each of the bonded semiconductor laser elements was operated, the operation was normal in all the elements, and the yield of the semiconductor element was 100%.

The 100 optical semiconductor devices assembled above were subjected to the same heat cycle test as in Example 1. Then, these 100 optical semiconductor devices were measured for electric resistance between the upper surface of each submount and the upper surface of each heat sink, which gave an average electric resistance of 0.018 Ω. Thus, electrical conduction was good even after the heat cycle test, and there was substantially no difference in average electric resistance between before and after the heat cycle test.

Also, the above 100 submounts were observed in the same manner as in Example 1 to examine the condition of the interface between the insulating substrate and the sintered molybdenum powder filled in the throughhole. As a result, there was no peeling at the interface.

EXAMPLE 3

In a commercial alumina substrate of 50 mm×50 mm×0.6 mm (thickness) having a thermal conductivity of 17 W/mK were formed, by laser processing, 3,600 throughholes each having a diameter of 100 μm. In each throughhole was filled a copper paste having a composition shown in Table 1. The resulting substrate was fired at 900° C. for 10 minutes in a nitrogen atmosphere to obtain an alumina substrate of 50 mm×50 mm×0.6 mm (thickness) having therein 3,600 throughholes filled with a sintered copper powder.

Figure 4:
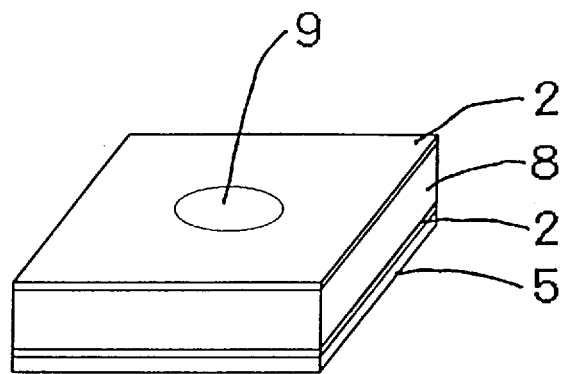
FIG. 4 is a schematic drawing showing other example of the submount of the present invention.

Using this alumina substrate, submounts of the same size, shown in FIG. 4 were produced. That is, the substrate 8 was subjected to mirror-like finishing (surface roughness Ra: 0.02 μm) at the two opposing surfaces so as to have a thickness of 0.2 mm. An electroconductive layer 2 [first layer/second layer/third layer=Ti (0.06 μm)/Pt (0.2 μm)/Au (0.8 μm)] was formed on each of the two opposing surfaces of the substrate after mirror-like finishing, by sputtering. On the lower electroconductive layer was formed a solder layer 5 (thickness: 10 μm) consisting of AuGe (Au: 88 wt. %), by vapor deposition. The resulting substrate having thereon two electroconductive layers 2 and a solder layer 5 was subjected to dicing to obtain submounts each of 0.5 mm×0.5 mm.

100 of these submounts were measured for electric resistance between the upper (top) surface and the lower (bottom) surface, which gave an average electric resistance of 0.010 Ω. To the upper surface of each submount was bonded a semiconductor laser element by the use of a PbSn solder (Sn: 60 wt. %), and a heat sink was bonded on the lower surface of each submount via the AuGe (Au: 88 wt. %) solder layer 5. Then, electric resistance was measured between the upper surface of each submount and the upper surface of each heat sink, which gave an average electric resistance of 0.012 Ω. Thus, electrical conduction was good even after bonding, and there was substantially no difference in average electric resistance between before and after bonding. When each of the bonded semiconductor laser elements was operated, the operation was normal in all the elements, and the yield of the semiconductor element was 100%.

The 100 optical semiconductor devices assembled above were subjected to the same heat cycle test as in Example 1. Then, these 100 optical semiconductor devices were measured for electric resistance between the upper surface of each submount and the upper surface of each heat sink, which gave an average electric resistance of 0.013 Ω. Thus, electrical conduction was good even after the heat cycle test, and there was substantially no difference in average electric resistance between before and after the heat cycle test.

Also, the above 100 submounts were observed in the same manner as in Example 1 to examine the condition of the interface between the insulating substrate and the sintered copper powder filled in the throughhole. As a result, there was no peeling at the interface.

EXAMPLE 4

An aluminum nitride substrate having therein throughholes filled with a sintered tungsten powder was produced in the same manner as in Example 1 except that the degreasing of the aluminum nitride green sheet was conducted in a humidified hydrogen atmosphere and its firing was conducted at 1,800° C. The substrate had a thermal conductivity of 180 W/mK.

Figure 5:
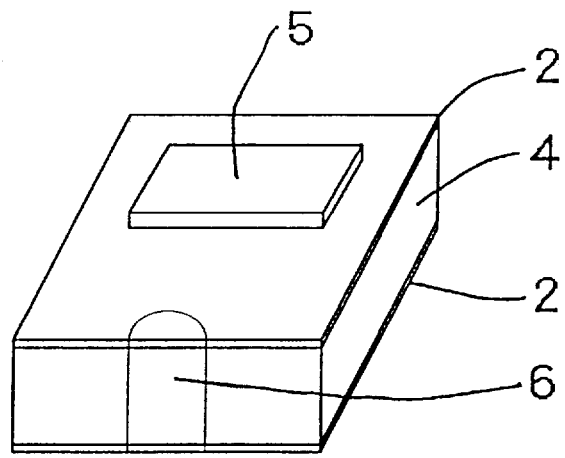
FIG. 5 is a schematic drawing showing other example of the submount of the present invention.

Using this aluminum nitride substrate, submounts of the same size, shown in FIG. 5 were produced. That is, on the substrate 4 were formed two electroconductive layers 2 and a solder layer 5 in the same manner as in Example 1. The substrate having two electroconductive layers 2 and a solder layer 5 was subjected to dicing at each position of the sintered tungsten powder, to obtain submounts each of 0.8 mm×0.7 mm.

100 of these submounts were measured for electric resistance between the upper (top) surface and the lower (bottom) surface, which gave an average electric resistance of 0.011 Ω. To each submount were bonded a semiconductor laser element and a heat sink in the same manner as in Example 1. Then, electric resistance was measured between the upper surface of each submount and the upper surface of each heat sink, which gave an average electric resistance of 0.012 Ω. Thus, electrical conduction was good even after bonding, and there was substantially no difference in average electric resistance between before and after bonding. When each of the bonded semiconductor laser elements was operated, the operation was normal in all the elements, and the yield of the semiconductor element was 100%.

The 100 optical semiconductor devices assembled above were subjected to the same heat cycle test as in Example 1. Then, these 100 optical semiconductor devices were measured for electric resistance between the upper surface of each submount and the upper surface of each heat sink, which gave an average electric resistance of 0.013 Ω. Thus, electrical conduction was good even after the heat cycle test, and there was substantially no difference in average electric resistance between before and after the heat cycle test.

Also, the above 100 submounts were observed in the same manner as in Example 1 to examine the condition of the interface between the insulating substrate and the sintered tungsten powder filled in the throughhole. As a result, there was no peeling at the interface.

EXAMPLE 5

100 submounts of the same size were produced in the same manner as in Example 3 except that the alumina substrate was replaced by an beryllia substrate (thermal conductivity: 250 W/mK).

These submounts were measured for electric resistance between the upper (top) surface and the lower (bottom) surface, which gave an average electric resistance of 0.005

Ω. To each submount were bonded a semiconductor laser element and a heat sink in the same manner as in Example 3. Then, electric resistance was measured between the upper surface of each submount and the upper surface of each heat sink, which gave an average electric resistance of 0.006 Ω. Thus, electrical conduction was good even after bonding, and there was substantially no difference in average electric resistance between before and after bonding. When each of the bonded semiconductor laser elements was operated, the operation was normal in all the elements, and the yield of the semiconductor element was 100%.

The 100 optical semiconductor devices assembled above were subjected to the same heat cycle test as in Example 1. Then, these 100 optical semiconductor devices were measured for electric resistance between the upper surface of each submount and the upper surface of each heat sink, which gave an average electric resistance of 0.008 Ω. Thus, electrical conduction was good even after the heat cycle test, and there was substantially no difference in average electric resistance between before and after the heat cycle test.

Also, the above 100 submounts were observed in the same manner as in Example 1 to examine the condition of the interface between the insulating substrate and the sintered copper powder filled in the throughhole. As a result, there was no peeling at the interface.

COMPARATIVE EXAMPLE 1

An aluminum nitride green sheet of 64 mm×64 mm×0.6 mm (thickness) was formed in the same manner as in Example 1. The green sheet was subjected to degreasing and firing under the same conditions as in Example 1 to obtain an aluminum nitride substrate of 54 mm×54 mm×0.4 mm (thickness) having no throughhole therein. The substrate was subjected to mirror-like finishing (surface roughness Ra: 0.03 μm) at the two opposing surfaces so as to have a thickness of 0.25 mm, after which two electroconductive layers and a solder layer were formed on the substrate in the same manner as in Example 1. The resulting material was subjected to dicing in the same manner as in Example 1 to obtain submounts each of 0.8 mm×0.7 mm.

To each of these 100 submounts were bonded a semiconductor laser element and a heat sink in the same manner as in Example 1. One end of a gold wire of 50 μm in diameter was bonded to the electroconductive layer adjacent to the semiconductor laser element and the other end of the wire was bonded to the surface of the heat sink.

For these 100 optical semiconductor devices, electric resistance was measured between the upper surface of the submount and the upper surface of the heat sink, which gave an average electric resistance of 0.1 Ω. When each of the bonded semiconductor elements was operated, the operation was normal in all the elements and the yield of the semiconductor element was normal. However, when the optical semiconductor devices were subjected to the same heat cycle test as in Example 1, wire breakage (no electrical conduction) occurred in 5 of the total 100 devices.

COMPARATIVE EXAMPLE 2

An aluminum nitride substrate of 54 mm×54 mm×0.4 mm (thickness) having throughholes each of 150 μm in diameter was formed in the same manner as in Example 2. This substrate was subjected to mirror-like finishing (surface roughness Ra: 0.02 μm) at the two opposing surfaces so as to have a thickness of 0.2 mm. On each of the two resulting surfaces was formed, by sputtering, an electroconductive layer [first layer/second layer/third layer=Ti (0.4 μm)/Ni (2.0 μm)/Au (1.0 μm)], and an electroconductive layer of the same composition was formed in each throughhole. The resulting material was subjected to dicing to obtain submounts each of 1.5 mm×1.0 mm.

100 of these submounts were measured for electric resistance between the upper surface and the lower surface, which gave an average electric resistance of 0.09 Ω. On each submount were bonded a semiconductor laser element and a heat sink by the use of a PbSn solder in the same manner as in Example 2. Then, electric resistance was measured between the upper surface of each submount and the upper surface of each heat sink, which gave an average electric resistance of 0.2 Ω. Although electrical conduction was good, the average electric resistance after bonding was more than two times the average electric resistance before bonding, and 10 of the total 100 assemblies showed electric resistances exceeding 1 Ω. This was because the solder diffused into the metallization layer in the throughhole, consequently the thickness of the pure metallization layer containing no solder became smaller, and a higher electric resistance was invited.

Each of the 100 bonded semiconductor laser elements was operated. However, 10 of the total 100 elements showing electric resistances higher than 1 Ω did not operate at all. 3 of the total 100 elements showing electric resistances of between 0.5 Ω and 1 Ω) did not reach a desired output. Therefore, the yield of the semiconductor element was 87%.

TABLE 1

| | Metal powder | | | Powdery additive for strengthening the bond between sintered metal powder and insulating substrate | | | Organic binder | | Organic solvent | |
|---|---|---|---|---|---|---|---|---|---|---|
| | | Average particle diameter (μm) | Amount (parts by weight) | | Average particle diameter (μm) | Amount (parts by weight) | | Amount (parts by weight) | | Amount (parts by weight) |
| | Kind | | | Kind | | | Kind | | Kind | |
| Example 1 | W | 2 | 100 | AlN | 0.6 (D1) | 4 | Ethyl cellulose | 1 | Butyl carbitol acetate | 6 |
| Example 2 | Mo | 1 | 100 | Ti | 1 | 5 | Ethyl cellulose | 2 | Terpineol | 10 |

TABLE 1-continued

Compositions of metal pastes

| | Metal powder | | | Powdery additive for strengthening the bond between sintered metal powder and insulating substrate | | | Organic binder | | Organic solvent | |
|---|---|---|---|---|---|---|---|---|---|---|
| Kind | Average particle diameter ($\mu$m) | Amount (parts by weight) | Kind | Average particle diameter ($\mu$m) | Amount (parts by weight) | Kind | Amount (parts by weight) | Kind | Amount (parts by weight) |
| Example 3 | Cu | 5 | 100 | Ti | 2 | 8 | Acrylic resin*1 | 4 | 2,2,4-Trimethyl-1,3-pentanediol monoisobutyrate*2 | 8 |
| Example 4 | W | 2 | 100 | AlN | 0.6 (D1) | 4 | Ethyl cellulose | 1 | Butyl carbitol acetate | 6 |
| Example 5 | Cu | 5 | 100 | Ti | 2 | 8 | Acrylic resin*1 | 4 | 2,2,4-Trimethyl-1,3-pentanediol monoisobuutyrate*2 | 8 |

*1CB-1 (trade name, a product of Sanyo Chemical Industries, Ltd.)
*2Texanol (trade name, a product of Kodak Co.)

What is claimed is:

1. A submount comprising:
    an insulating substrate having therein a throughhole filled with a sintered metal powder containing 1.0 to 10% by weight of an aluminum nitride powder or titanium powder dispersed therein for strengthening a bond between the insulating substrate and said sintered metal powder, and
    an electroconductive layer formed on each of the two opposing surfaces of the insulating substrate, wherein the two electroconductive layers are electrically connected with each other at least partially by the sintered metal powder filled in the throughhole of the insulating substrate.

2. The submount according to claim 1, wherein the insulating substrate is aluminum nitride, beryllium oxide or aluminum oxide.

3. The submount according to claim 1, wherein the insulating substrate has a thermal conductivity of 170 W/mK or more.

4. The submount according to claim 1, wherein the insulating substrate has a thermal conductivity of 200 W/mK or more.

5. The submount according to claim 1, wherein each electroconductive layer consists of a single layer made of titanium, chromium, molybdenum, tungsten, a tungsten-titanium alloy, aluminum, nickel chromium alloy, tantalum or tantalum nitride.

6. The submount according to claim 1, wherein each electroconductive layer consists of three layers, i.e. a first layer directly contacting with the surface of the insulating substrate, a second layer formed on the first layer and a third layer formed on the second layer and wherein the first layer is made of titanium, chromium, molybdenum, tungsten, a tungsten-titanium alloy, aluminum, nickel-chromium alloy, tantalum or tantalum nitride, the second layer is made of copper, nickel, palladium, platinum or gold, and the third layer is made of gold, silver, palladium or platinum.

7. The submount according to claim 1, wherein the metal constituting the sintered metal powder is tungsten, molybdenum, copper, silver, gold, nickel or palladium.

8. The submount according to claim 1, wherein the throughhole has a diameter of 0.1–0.8 mm.

9. The submount according to claim 1, wherein the sintered metal powder has an electric resistance of 0.001–0.5 Ω.

10. The submount according to claim 1, wherein the sintered metal powder has an electric resistance of 0.001–0.1 Ω.

11. The submount according to claim 1, wherein the powdery additive has an average particle diameter of 0.5–5 Ω.

12. The submount according to claim 1, wherein the sintered metal powder filled in the throughhole is formed by filling, in the throughhole, a metal paste comprising a metal powder, an organic binder, an organic solvent and a powdery additive for strengthening a bond between the insulating substrate and the sintered metal powder, and then conducting firing.

13. The submount according to claim 12, wherein the metal paste comprises 100 parts by weight of the metal powder, 0.1–5 parts by weight of the organic binder, 1–20 parts by weight of the organic solvent and 1–10 parts by weight of the powdery additive.

14. The submount according to claim 12 or 13, wherein the metal powder has an average particle diameter of 0.1–20 $\mu$m.

15. The submount according to claim 12 or 13, wherein the organic binder is an acrylic resin, or a cellulose such as ethyl cellulose, nitrocellulose, acetyl cellulose, cellulose acetate propionate, cellulose acetate butyrate or the like.

16. The submount according to claim 12 or 13, wherein the organic solvent is terpineol, carbitol, butyl carbitol, butyl carbitol acetate, carbitol acetate, 2,2,4-trimethyl-1,3-pentanediol monoisobutyrate, cellosolve, methyl cellosolve, butyl cellosolve, cellosolve acetate, butyl cellosolve acetate or n-butyl acetate.

* * * * *